United States Patent
Yin et al.

(10) Patent No.: US 8,011,931 B2
(45) Date of Patent: Sep. 6, 2011

(54) PROBE CONNECTOR

(75) Inventors: Te-Hung Yin, Tu-Cheng (TW); Yung-Yi Chen, Tu-Cheng (TW); Jui-Pin Lin, Tu-Cheng (TW); Shu-Fang Li, Tu-Cheng (TW)

(73) Assignee: Cheng Uei Precision Industry Co., Ltd., Tu-Cheng, Taipei Hsien (TW)

( * ) Notice: Subject to any disclaimer, the term of this patent is extended or adjusted under 35 U.S.C. 154(b) by 542 days.

(21) Appl. No.: 12/250,837

(22) Filed: Oct. 14, 2008

(65) Prior Publication Data

US 2010/0089187 A1 Apr. 15, 2010

(51) Int. Cl.
*H01R 4/48* (2006.01)
*H01R 13/24* (2006.01)
*G01R 1/067* (2006.01)

(52) U.S. Cl. ............... 439/38; 324/754.14; 324/754.17; 324/755.05; 439/816

(58) Field of Classification Search .............. 73/866.5; 324/754.14, 754.17, 754.25, FOR. 107–FOR. 108; 403/327; 439/38–40, 66, 482, 700, 786, 439/816, 819, 824
See application file for complete search history.

(56) References Cited

U.S. PATENT DOCUMENTS

| | | | | |
|---|---|---|---|---|
| 2,901,691 A | * | 8/1959 | Forster | 324/243 |
| 3,123,713 A | * | 3/1964 | Maud et al. | 250/496.1 |
| 3,171,549 A | * | 3/1965 | Orloff | 414/6 |
| 3,549,842 A | * | 12/1970 | Fischer et al. | 218/60 |
| 6,340,320 B1 | * | 1/2002 | Ogawa | 439/824 |
| 6,796,850 B2 | * | 9/2004 | Matsui et al. | 439/700 |
| 6,822,171 B2 | * | 11/2004 | Bennett et al. | 177/25.18 |
| 6,870,454 B1 | * | 3/2005 | Vladimirescu et al. | 335/220 |
| 6,957,986 B2 | * | 10/2005 | Jing | 439/700 |
| 7,201,613 B2 | * | 4/2007 | Sasaki | 439/700 |
| 7,914,348 B1 | * | 3/2011 | Lin | 439/700 |
| 2004/0077225 A1 | * | 4/2004 | Chun-Fu | 439/700 |
| 2009/0260456 A1 | * | 10/2009 | Degli Esposti et al. | 73/863.21 |

FOREIGN PATENT DOCUMENTS

| | | | |
|---|---|---|---|
| JP | 2002042945 A | * | 2/2002 |
| JP | 2004093333 A | * | 3/2004 |

* cited by examiner

*Primary Examiner* — Thomas P Noland
(74) *Attorney, Agent, or Firm* — Muncy, Geissler, Olds & Lowe, PLLC

(57) ABSTRACT

A probe connector includes a barrel, a plunger, an elastic element, at least one first magnet, and at least one second magnet. The barrel defines an enclosure surrounding a chamber. An opening is formed at one end of the barrel. The elastic element is arranged in the chamber of the barrel. The plunger has a basic portion received in the chamber and against one end of the elastic element, and a contact portion extending out of the chamber through the opening. The first magnet is disposed on the enclosure of the barrel. The second magnet is disposed on the basic portion of the plunger. When the plunger is pressed inward, the plunger is leant towards one side with the basic portion against the enclosure because of the second magnet approaching the first magnet to produce a magnetic force interaction therebetween.

5 Claims, 1 Drawing Sheet

PROBE CONNECTOR

BACKGROUND OF THE INVENTION

1. Field of the Invention

The present invention relates to a connector, and particularly to a probe connector.

2. The Related Art

A conventional probe connector includes a barrel, a plunger, and an elastic element. The elastic element is arranged in the barrel. One end of the plunger is disposed inside the barrel and propped on the elastic element, and the other end of the plunger extends out of the barrel. In use, the plunger is pressed inwards to compress the elastic element, and then the elastic element makes the plunger lean and electrically connect the barrel. However, the connection between the plunger and the barrel is unsteady when the plunger moves in the barrel.

To solve the problem described above, a ramp is defined on the end of the plunger propped on the elastic element or the elastic element is arranged eccentrically in the barrel, which makes the connection between the plunger and the barrel steadily when the plunger moves in the barrel. However, the connection between the plunger and the barrel may be cut off when the probe connector is suffered from shock or the like.

SUMMARY OF THE INVENTION

Accordingly, an object of the present invention is to provide a probe connector. The probe connector includes a barrel, a plunger, an elastic element, at least one first magnet, and at least one second magnet. The barrel defines an enclosure surrounding a chamber. An opening is formed at one end of the barrel. The elastic element is arranged in the chamber of the barrel. The plunger has a basic portion received in the chamber and against one end of the elastic element, and a contact portion extending out of the chamber through the opening. The first magnet is disposed on the enclosure of the barrel. The second magnet is disposed on the basic portion of the plunger. When the plunger is pressed inwards, the plunger is leant towards one side with the basic portion against the enclosure because of the second magnet approaching the first magnet to produce a magnetic force interaction therebetween.

As described above, when the plunger is pressed to move downwards by an outer force, the second magnet approaches the first magnet to produce the magnetic force interaction therebetween. So the plunger is leant and then contacts an inner surface of the barrel. Due to magnetic force interaction between the first magnet and the second magnet, the connection between the plunger and the barrel is steady even though the probe connector is suffered from shock or the like, which prevents the electrical connection between the plunger and barrel being cut off suddenly.

BRIEF DESCRIPTION OF THE DRAWINGS

The present invention will be apparent to those skilled in the art by reading the following description of preferred embodiments thereof, with reference to the attached drawings, in which.

DETAILED DESCRIPTION OF THE PREFERRED EMBODIMENTS

Figure 1:
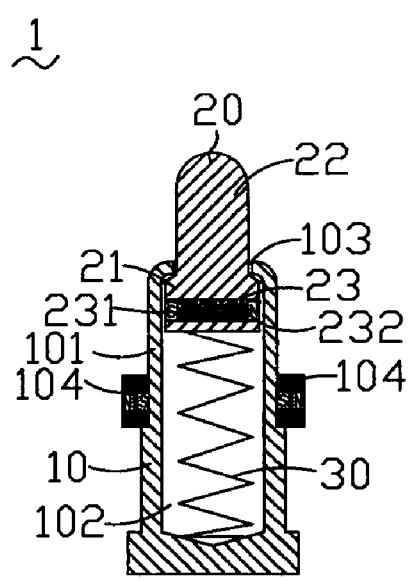
FIG. 1 is a cross-sectional view of a probe connector in accordance with a first embodiment of the present invention.

With reference to FIG. 1, a probe connector 1 in accordance with a first embodiment of the present invention comprises a barrel 10, a plunger 20, and an elastic element 30. The barrel 10 and the plunger 20 are made of metallic material.

The barrel 10 defines an enclosure 101 to surround a chamber 102 therein. One end of the barrel 10 is sealed and the opposite end has an opening 103. A ring-shaped first magnet 104 is disposed at a middle portion of an outer surface of the enclosure 101 of the barrel 10. In this embodiment, a south magnetic pole of the first magnet 104 faces the enclosure 101.

The plunger 20 includes a basic portion 21 and a contact portion 22 extending from one end of the basic portion 21. The basic portion 21 is received in the chamber 102 of the barrel 10 and the contact portion 22 extends out of the barrel 10 through the opening 103. The outer dimension of the basic portion 21 is less than the inner dimension of the barrel 10 for allowing the basic portion 21 movably received within the chamber 102. The dimension of the opening 103 is less than the dimension of the outer dimension of the basic portion 21 for preventing the basic portion 21 being removed from the chamber 102. A piece of second magnet 23 with a south magnetic pole 231 and a north magnetic pole 232 is fixed in a bottom side of the basic portion 21. The magnetic field caused by the first magnet 104 is substantially parallel to that of the second magnet 23.

The elastic element 30 is received in the chamber 102 of the barrel 10. Two opposite ends of the elastic element 30 respectively resist on the sealed end of the barrel 10 and the bottom side of the basic portion 21 of the plunger 20.

Figure 2:
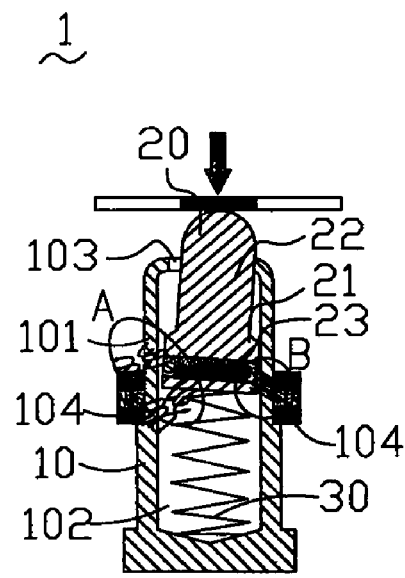
FIG. 2 is a cross-sectional view of the probe connector shown in FIG. 1 for showing a plunger moving inwards.

Please refer to FIG. 2, in use, the plunger 20 is pressed to move downwardly by an outer force. The elastic element 30 is compressed and the second magnet 23 gradually approaches the first magnet 104. The two opposite magnetic poles 231, 232 of the second magnet 23 fixed in the plunger 20 are respectively repulsed and attracted by the first magnet 104 simultaneously (region A and B shown in FIG. 2). So the plunger 20 is leant and then contacts an inner surface of the enclosure 101 of the barrel 10. Due to the magnetic repulsion force and magnetic attraction force, the connection between the plunger 20 and the barrel 10 is steady even though the probe connector 1 is suffered from shock or the like, which prevents the electrical connection between the plunger 20 and barrel 10 being cut off suddenly.

Figure 3:
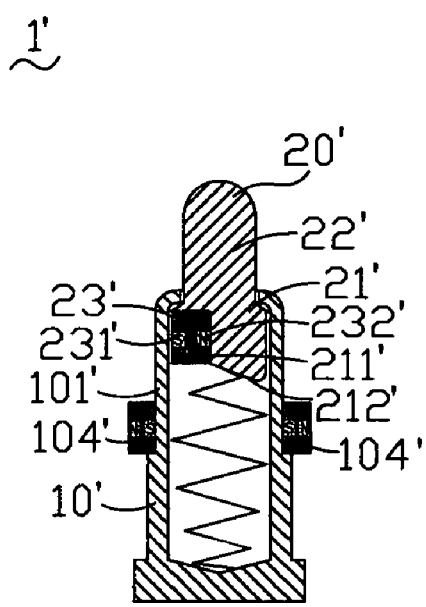
FIG. 3 is a cross-sectional view of a probe connector in accordance with a second embodiment of the present invention.

Referring to FIG. 3, a probe connector 1' in accordance with a second embodiment of the present invention is shown. The probe connector 1' in this embodiment is similar to the probe connector 1 in the first embodiment. The probe connector 1' in this embodiment includes a barrel 10' with an enclosure 101' therearound, a plunger 20' and an elastic element 30'. A ring-shaped first magnet 104' is disposed at a middle portion of an outer surface of the enclosure 101' of the barrel 10'. The plunger 20' includes a basic portion 21' and a contact portion 22' extending from one end of the basic portion 21'. A bottom side of the basic portion 21' is a ramp 212'. A recess 211' is defined in a lateral side of the basic portion 21' and passes through the bottom side. A block of second magnet 23' with a south magnetic pole 231' and a north magnetic pole 232' is fixed in the recess 211'. The inclined direction of the plunger 20' caused by the elastic element 30 and the ramp 212' is corresponding with the inclined direction of the plunger 20 caused by the magnetism of the first magnet 104' and the second magnet 23'.

Figure 4:
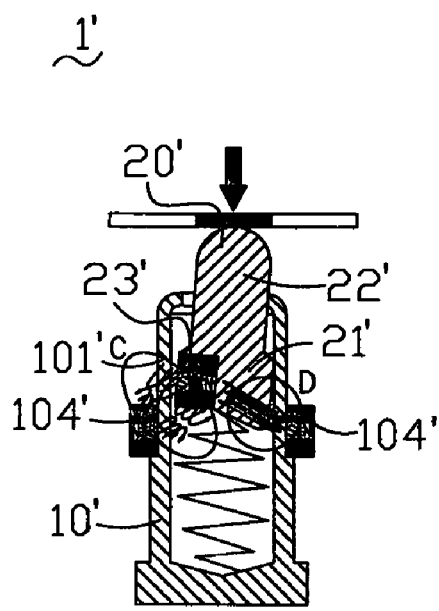
FIG. 4 is a cross-sectional view of the probe connector shown in FIG. 3 for showing a plunger moving inwards.

Please refer to FIG. 4, in use, the plunger 20' is pressed to move downwardly by an outer force and then the elastic element 30' is compressed. The plunger 20' is leant due to the ramp 212' and the elasticity of the elastic element 30' and contacts an inner surface of the barrel 10'. Moreover, two opposite magnetic poles 231', 232' of the second magnet 23' fixed in the plunger 20' are respectively repulsed and attracted by the first magnet 104' simultaneously (region C and D shown in FIG. 4), which makes the plunger 20' lean at the same direction. Due to the magnetic repulsion force and magnetic attraction force, the connection between the plunger 20' and the barrel 10' is steady even though the probe connector 1' is suffered from shock or the like, which prevents the electrically connection between the plunger 20' and barrel 10' being cut off suddenly.

The foregoing description of the present invention has been presented for purposes of illustration and description. It is not intended to be exhaustive or to limit the invention to the precise form disclosed, and obviously many modifications and variations are possible in light of the above teaching. Such modifications and variations that may be apparent to those skilled in the art are intended to be included within the scope of this invention as defined by the accompanying claims.

What is claimed is:

1. A probe connector, comprising:
    a barrel defining an enclosure surrounding a chamber, an opening formed at one end thereof;
    an elastic element disposed in the chamber of the barrel;
    a plunger having a basic portion received in the chamber and against one end of the elastic element, and a contact portion extending out of the chamber through the opening;
    at least one first magnet disposed on the enclosure of the barrel; and
    at least one second magnet disposed on the basic portion of the plunger;
    wherein when the plunger is pressed inward, the plunger is leant towards one side with the basic portion against the enclosure because of the second magnet approaching the first magnet to produce a magnetic force interaction therebetween.

2. The probe connector claimed as in claim 1, wherein the magnetic field caused by the first magnet is substantially parallel to that of the second magnet.

3. The probe connector claimed as in claim 1, wherein the first magnet is of a ring-shaped and surrounds the enclosure of the barrel.

4. The probe connector claimed as in claim 1, wherein a bottom of the basic portion is a ramp against the elastic element, an inclined direction of the plunger caused by the elastic element and the ramp is corresponding with an inclined direction of the plunger caused by the magnetic force interaction of the first magnet and the second magnet.

5. The probe connector claimed as in claim 4, wherein a lateral side of the basic portion defines a recess, the second magnet is received in the recess.

* * * * *